(12) United States Patent
Teixeira et al.

(10) Patent No.: US 7,321,161 B2
(45) Date of Patent: Jan. 22, 2008

(54) LED PACKAGE ASSEMBLY WITH DATUM REFERENCE FEATURE

(75) Inventors: Fernando M. Teixeira, Santa Clara, CA (US); Robert L. Steward, Sunnyvale, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 44 days.

(21) Appl. No.: 10/741,931

(22) Filed: Dec. 19, 2003

(65) Prior Publication Data

US 2005/0135105 A1 Jun. 23, 2005

(51) Int. Cl.
*H01L 23/495* (2006.01)

(52) U.S. Cl. .............. 257/675; 257/98; 257/99; 257/100; 257/625; 257/676; 257/706; 257/718; 257/720

(58) Field of Classification Search .............. 257/98, 257/99, 100, 676, 678, 706, 718; 362/294, 362/236
See application file for complete search history.

(56) References Cited

U.S. PATENT DOCUMENTS

| | | | |
|---|---|---|---|
| 4,884,086 A | 11/1989 | Kirk et al. ............ 346/155 |
| 6,023,104 A | 2/2000 | Koizumi et al. ........... 257/797 |
| 6,274,924 B1 | 8/2001 | Carey et al. ............. 257/676 |
| 6,541,800 B2 | 4/2003 | Barnett et al. ............ 257/98 |
| 2002/0176250 A1* | 11/2002 | Bohler et al. ............ 362/236 |
| 2003/0076034 A1* | 4/2003 | Marshall et al. ........... 313/512 |
| 2003/0168720 A1* | 9/2003 | Kamada .................. 257/666 |
| 2004/0065894 A1* | 4/2004 | Hashimoto et al. ........ 257/100 |
| 2004/0189170 A1* | 9/2004 | Aisenbrey ............... 313/248 |
| 2004/0201025 A1* | 10/2004 | Barnett et al. ............. 257/79 |

* cited by examiner

*Primary Examiner*—Evan Pert
*Assistant Examiner*—Tan Tran

(57) ABSTRACT

An LED package includes a datum reference feature that is external to the insulating body of the LED package and has a known, fixed relationship to the heat sink. The LED die is mounted to the heat sink such that the LED die has a fixed relationship to the heat sink. Accordingly, the reference datum feature provides a frame of reference to the position of the LED die within the LED package. The reference datum feature may be mounted to the heat sink or integrally formed from the heat sink. A pick-and-place head holds the LED package by engaging the datum reference feature, e.g., with an alignment pin. In addition, the LED package may include a lead that extends laterally into the insulating body, and extends towards the LED die to reduce the vertical distance between the lead and the LED die.

21 Claims, 8 Drawing Sheets

LED PACKAGE ASSEMBLY WITH DATUM REFERENCE FEATURE

FIELD OF THE INVENTION

This invention relates to LEDs (light emitting diodes), and more specifically, to the precision alignment of LEDs, e.g., for inspection and mounting.

BACKGROUND

Performance of an LED, particularly in a high performance optical system, is limited by the precision and consistency of the location the LED die within the LED package and to the precision of mounting the LED package on an electrical circuit board or other mounting surface. The optical centering or the precision of mounting the LED package on a mounting surface is particularly important, e.g., when secondary optics are used, such as in automotive forward lighting lamps. Conventional techniques of aligning the LED die and package are inadequate for many high performance applications.

Current methods of aligning the LED die within the package and the package to the mounting surface is based on standard semiconductor assembly techniques. Accordingly, attempts to improve the alignment accuracy of an LED die and package are focused on controlling semiconductor assembly variations. Conventional semiconductor techniques of aligning the die and package are generally inaccurate because non-LED type semiconductor applications are not concerned with light emission.

For example, conventional pick and place mounting of LED packages uses the outside edges of the LED package or the electrical leads of the package. However, the outside edges of the LED package are typically molded plastic or cast epoxy materials, which are dimensionally inaccurate. Moreover, package electrical leads are generally formed from sheet metal, which is unsuitable for high precision alignment. Thus, the positional relationship of the LED die within the package to the outside edges or leads of the LED package is generally too imprecise for high precision alignment.

Accordingly, what is needed is a system and method that improves the alignment accuracy of an LED package is desired.

SUMMARY

An LED package includes a datum reference feature that is external to the insulating body of the LED package and has a known, fixed relationship to the heat sink. The LED die is mounted to the heat sink such that the LED die has a fixed relationship to the heat sink. Accordingly, the reference datum feature provides a frame of reference to the position of the LED die within the LED package. The reference datum feature may be mounted to the heat sink or integrally formed from the heat sink. A pick-and-place head holds the LED package by engaging the datum reference feature, e.g., with an alignment pin. In addition, the LED package may include a lead that extends laterally into the insulating body, and extends towards the LED die to reduce the vertical distance between the lead and the LED die.

In one aspect of the present invention, an assembly includes an LED die and a heat sink to which the LED die is coupled so that the LED die has a known positional relationship to the heat sink. The assembly further includes an insulating body that at least partially surrounds the heat sink and at least one datum reference feature that is external to the insulating body. The datum reference feature has a fixed relationship to the heat sink such that the datum reference feature provides a reference for the position of the LED die.

In another aspect, a method of assembling an LED package includes providing a datum reference feature that is indicative of the position of a heat sink and mounting an LED die to the heat sink. An insulating body is then formed around at least a portion of the heat sink so that the datum reference feature is external to the insulating body.

In another aspect, a method includes providing an LED package having a datum reference feature that is external to the insulating body of the LED package, where the datum reference feature has fixed relationship to the LED die in the LED package. The method further includes engaging the datum reference feature with an alignment pin and holding the LED package using the engaged datum reference feature.

In yet another embodiment of the present invention, an LED package includes an LED die and a heat sink, to which the LED die is coupled. An insulating body at least partially surrounds the heat sink and a lens is mounted to the insulating body. A plurality of leads extend out of the insulating body, at least one lead extends laterally into the insulating body at a first vertical distance from the LED die. The lead extends through the insulating body to a second vertical distance from the LED die, where the second vertical distance is less than the first vertical distance. A bond wire electrically couples the lead and the LED die.

DETAILED DESCRIPTION

An LED, in accordance with one embodiment of the present invention, includes one or more datum reference features that are external to the LED package, but that provide an accurate reference to the position of the LED die within the package. Using the datum reference features, the inspection and mounting accuracy, optical centering, of the LED package is significantly improved. Optical centering of the LED to its desired position is particularly important in high brightness application, such as automotive forward lighting lamps.

Figure 1A:
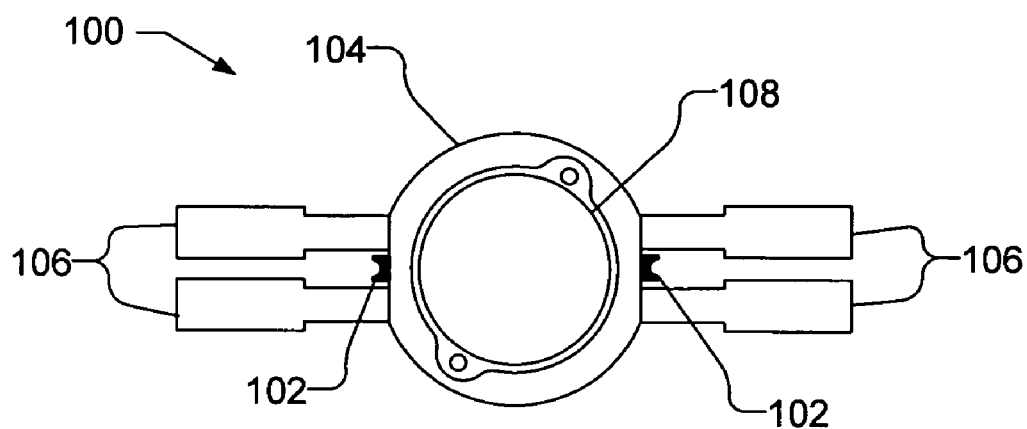
FIGS. 1A and 1B illustrate a top plan view and a side view of an LED package that includes datum reference features.
Figure 1B:
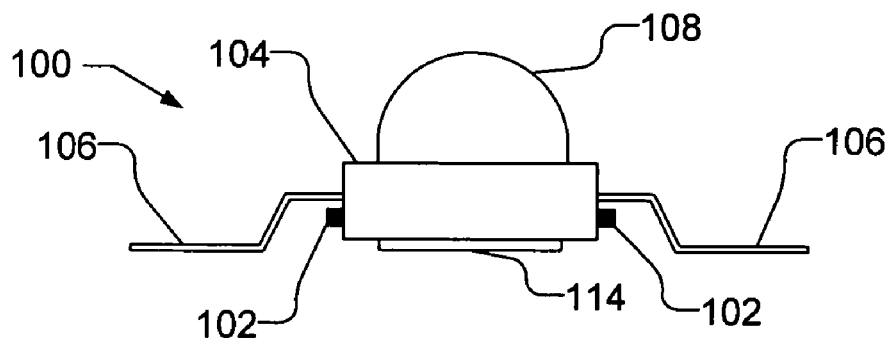
Figure 2:
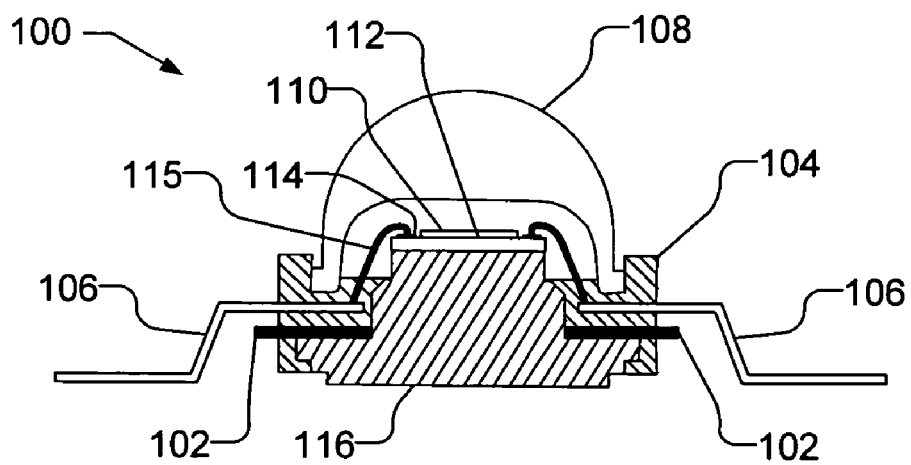
FIG. 2 illustrates a cross sectional view of the LED package of FIGS. 1A and 1B.

FIGS. 1A and 1B illustrate a top plan view and a side view of an LED package 100 that includes datum reference features 102, sometimes referred to simply as a reference feature, that may be used to accurately position the LED package 100. FIG. 2 illustrates a cross sectional view of LED package 100. LED package 100 includes an insulating body 104, a plurality of leads 106 extending from the body 104 and a lens 108 fitted on the body 104. While four leads 106 are shown in FIGS. 1A and 1B, it should be understood that two leads may be used if desired.

As illustrated in the cross-sectional view of FIG. 2, LED package 100 includes an LED die 110 that is mounted on a submount 112. Submount 112 may be electrically conductive or insulating. Submount 112 may be made of silicon, copper, silver, diamond, aluminum, tungsten, molybdenum, beryllium, alumina, aluminum nitride, beryllium oxide, boron nitride or other thermally conductive materials, compounds, or composites. In the present embodiment, LED die 110 is bonded to submount 112 by soldering a ball grid array on submount 112 to contact pads on LED die 110 with solder. Submount 112 is formed with conductive traces that couple the LED die 110 to bond wire contacts 114. Zener diodes may be formed in the path of the traces to protect against electrostatic discharge. Bond wires 115 couple the bond wire contacts 114 on submount 112 to the leads 106. With the use of four leads 106, a plurality of LED dice may be used if desired. Only a single LED die 110 is shown in FIG. 2 for the sake of simplicity.

As can be seen in FIG. 2, submount 112 is mounted on the top mating surface of a heat sink 116 (also called a "slug"). Slug 116 may be made of silicon, copper, silver, diamond, aluminum, tungsten, molybdenum, beryllium, alumina, aluminum nitride, beryllium oxide, boron nitride or other thermally conductive materials, compounds, or composites. The mounting of the submount 112 onto the slug 116 should be performed so that the submount 112, and thus LED die 110, is accurately aligned and bonded to slug 116. With the LED die accurately aligned and bonded to slug 116, via submount 112, the LED die 110 has a known, fixed relationship to the slug 116, e.g., the LED die 110 may be approximately in the center of the slug 116 (where one LED die is used).

In one embodiment, the submount 112 and slug 116 have bonding surfaces that are have substantially the same shape and area. A solder reflow process can then be used to align the bonding surface of the submount 112 to the bonding surface of the slug 116 by the surface tension of the molten solder. One method of accurately aligning and bonding the LED die 110 to the slug 116 is described in U.S. Ser. No. 10/346,535, entitled "Accurate Alignment of an LED Assembly", by Cresente S. Elpedes et al., which was filed on Jan. 16, 2003, and which is has the same assignee as the present disclosure and which is incorporated herein by reference. If desired, other methods of accurately aligning the LED die 110 to the slug 116 may be used.

The datum reference features 102 are configured to have a known fixed positional relationship to the slug 116. Because the submount 112, and thus, the LED die 110, have a known position with respect to the slug 116, the datum reference features 102 thus provide a reference for the position of the LED die 110, e.g., via the slug 116 and submount 112.

Figure 3:
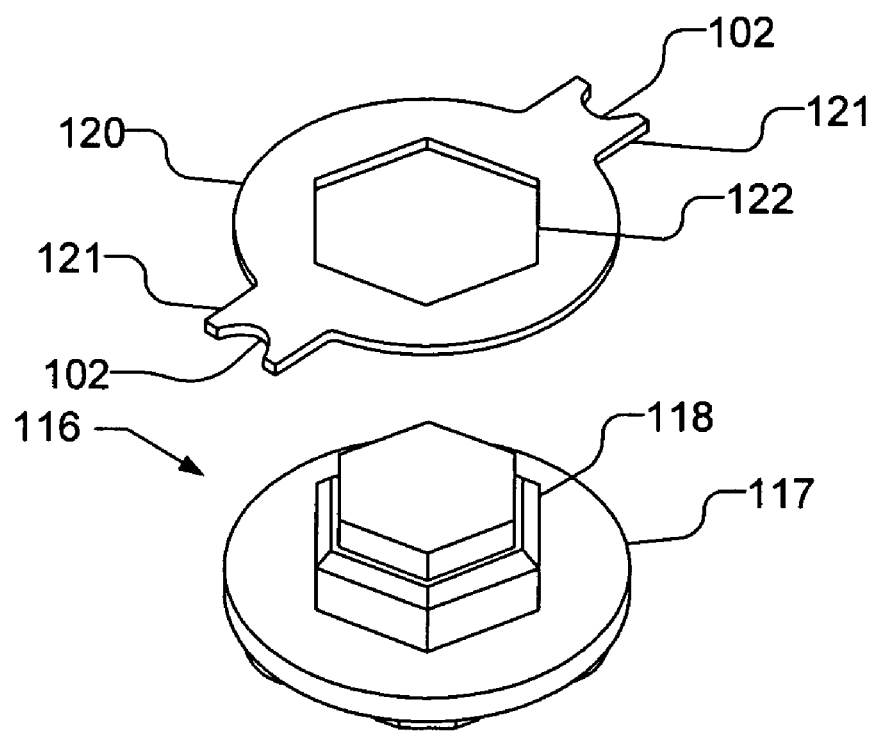
FIG. 3 shows an exploded perspective view of a collar that includes outward extending the datum reference features and a heat sink.

By way of example, the datum reference features may be formed from an element that is mounted to the slug 116. FIG. 3 shows an exploded perspective view of a collar 120 with outward extending tabs 121 that include datum reference features 102. FIG. 3 also shows a perspective view of the slug 116. As illustrated in FIG. 3, the slug 116 includes a disk portion 117 and a raised portion 118 that extends from the center of the disk portion 117. The collar 120 includes a center aperture 122 that has the same geometric shape, e.g., hexagonal, as the raised portion 118 of the slug 116, which permits the collar 120 to be press fit, or otherwise mounted, onto slug 116. Of course, other geometric shapes may be used if desired. Once the collar 120 is mounted on the slug 116, the datum reference features 102 have a known fixed positional relationship to the slug 116.

Collar 120 may be manufactured from thermally stable material, such as steel, stainless steel, plated copper, brass, or any other thermally stable materials, compounds, or composites. The collar 120 may be 0.010" thick and manufactured, e.g., by stamping or etching.

It should be understood that the configuration of the slug 116 and collar 120 may differ from that shown without departing from the scope of the present invention. For example, the collar 120 may have no center aperture may be may be mounted to the slug 116 in substantially the same way as submount 112 described above. Moreover, if desired, the submount 112 may be mounted to the collar 120, and the collar 120 is mounted to the slug 116. Where the submount 112 is mounted to the collar 120, the collar 120 should provide heat sinking properties as well.

Figure 4:
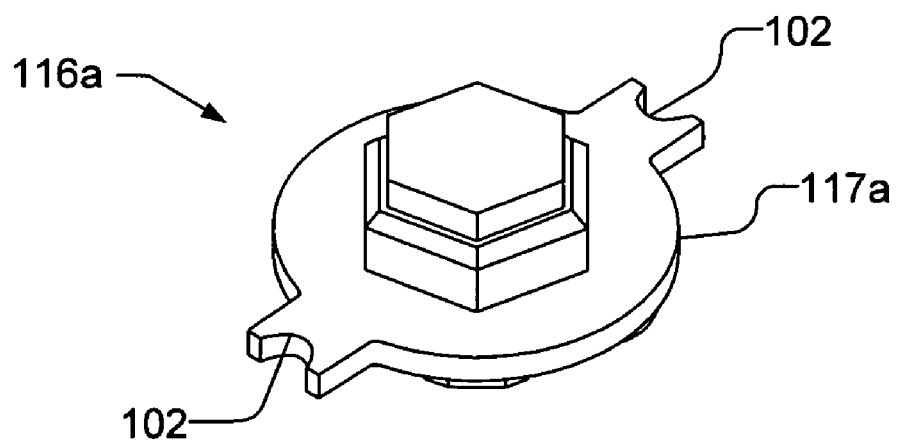
FIG. 4 illustrates a perspective view of another embodiment of the heat sink.

Another embodiment of a slug 116a is illustrated in perspective view in FIG. 4. Slug 116a is similar to slug 116 shown in FIG. 3, however, the datum reference features 102 are made integral to the disk portion 117a of slug 116a. Thus, with the use of slug 116a with integral datum reference features, the datum reference features have a known fixed position with respect to the LED die 110 without the need for a separate collar 120.

Referring back to FIGS. 1A, 1B, and 2, the slug 116 is at least partially disposed within the insulating body 104. Body 104 may be made of any dielectric material such as plastic or epoxy. Body 104 may be conventionally formed by placing the various components, e.g., slug 116, leads 106, and collar 120 in their desired configurations and injecting the body material into a mold. Forming an insulating body for an LED package is well known in the art. As illustrated in FIGS. 1A, 1B, and 2, the leads 106 and datum reference features 102 extend outwardly from the body 104. Thus, the datum reference features 102 are externally accessible. With the body 104 formed, the lens 108 is fitted on body 104. An encapsulant may fill lens 108 to protect the LED die 110.

Because the datum reference features 102 are externally accessible and provide an accurate frame of reference to the position of the LED die within the LED package, the reference features 102 advantageously provide a means for accurately aligning the LED die during inspection and mounting. By way of example, the positional tolerance of an LED package with datum reference features 102 is approximately ±0.2 mm or better, while LED packages without such datum reference features have a position tolerance of approximately ±0.5 mm.

As can be seen in FIG. 1A, the datum reference features 102 are configured as semicircular indentations. If desired, however, other configurations may be used for the datum reference features, including other types of indentations or projections.

Figure 5A:
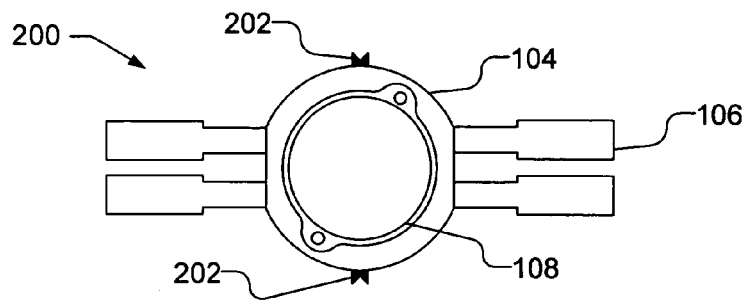
FIGS. 5A and 5B illustrate a top plan view and a side view, respectively, of another embodiment of an LED package with datum reference features.
Figure 5B:
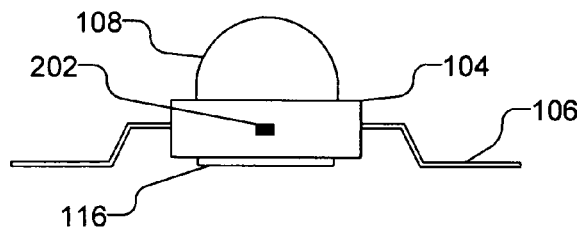

FIGS. 5A and 5B illustrate a top plan view and a side view, respectively, of another embodiment of an LED package 200 that includes "V" shaped datum reference features 202. LED package 200 is similar to LED package 100, like designed elements being the same. LED package 200, however, includes "V" shaped reference features 202, which are oriented on the insulating body 104 at a position that is 90 degrees to the leads 106.

Figure 6A:
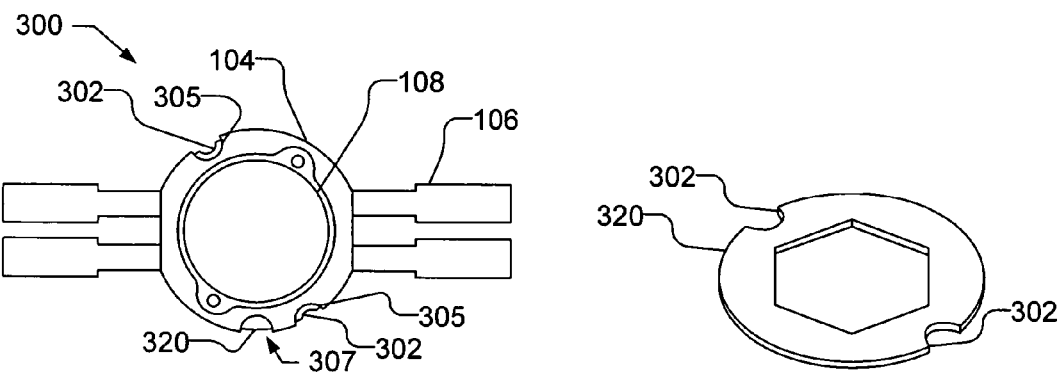
FIGS. 6A and 6B illustrate a top plan view and a side view, respectively, of another embodiment of an LED package with datum reference features.
Figure 6B:
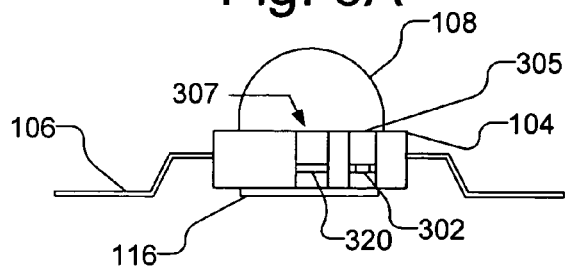

FIGS. 6A and 6B illustrate a top plan view and a side view, respectively, of another embodiment of an LED package 300 that includes datum reference features 302. LED package 300 is similar to LED package 100, like designed elements being the same. As illustrated in FIGS. 6A and 6B, datum reference features 302 do not extend outward from the body 104, but instead body 104 includes a recessed portion 305 that exposes the reference features 302. The reference features 302 are shown with a semicircular indentation that is exposed by the recessed portion 305.

Figure 6C:
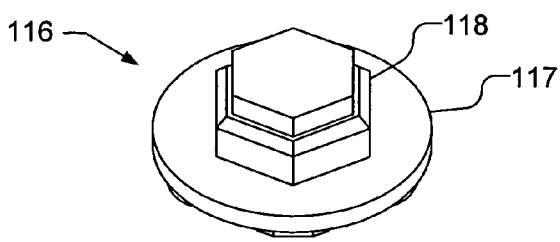
FIG. 6C illustrates a collar and heat sink that may be used with an LED package.

FIG. 6C illustrates the collar 320 and slug 116 that may be used with LED package 300. As can be seen, the reference features 302 do not need to be formed from tabs that extend from the collar 320, but can be indentations in the collar 330. The indentations in the collar 330 are exposed by the recessed portion 305 of the body 104.

As illustrate din FIG. 6A, the datum reference features 302 are oriented on the insulating body 104 at a position that is approximately 45 degrees to the leads 106. In addition, the body 104 includes an orientation feature 307, which is an additional recessed portion 307, which may expose a portion of the collar 320. The orientation feature 307 permits a user to easily determine the anode and cathode leads.

As discussed above, the reference features 302 may be integrally formed as part of the disk 117 of the slug 116, thereby obviating the need for a separate collar 320. In other words, the slug itself, or features thereof, may be used as the reference feature.

Figure 7A:
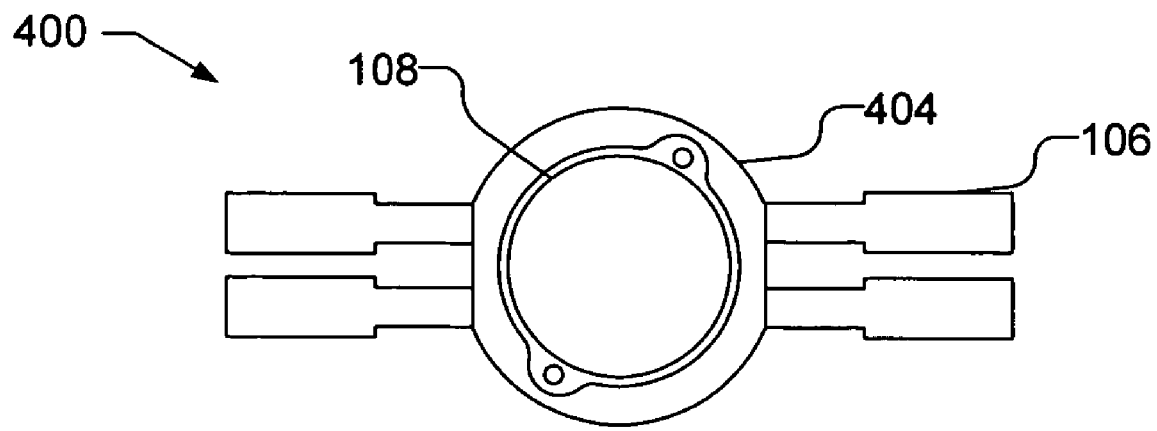
FIGS. 7A, 7B, and 7C illustrate a top plan view, a side view, and a bottom plan view, respectively, of another embodiment of an LED package with datum reference features.
Figure 7B:
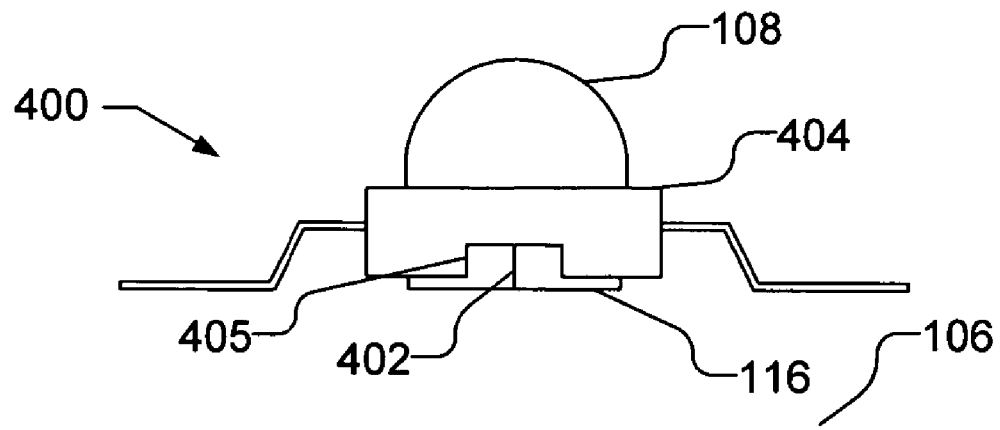
Figure 7C:
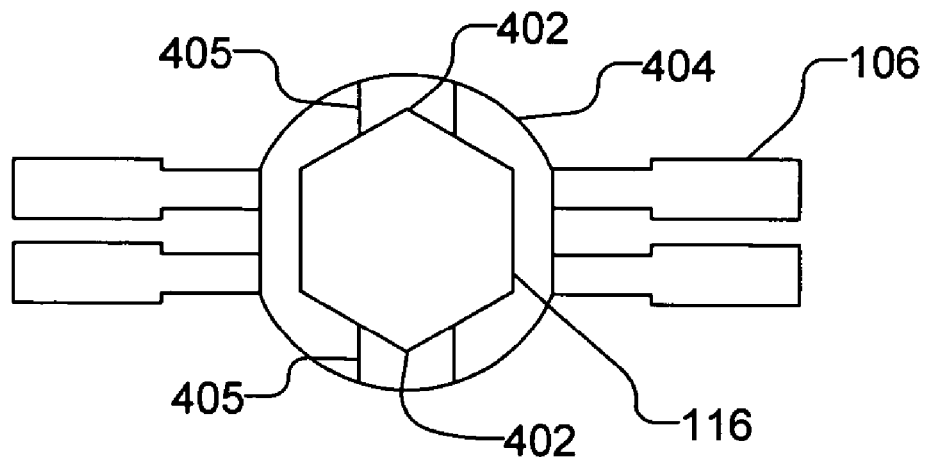

FIGS. 7A, 7B, and 7C illustrate a top plan view, a side view, and a bottom plan view, respectively, of another embodiment of an LED package 400 that includes reference features 402, which are integrally formed from the slug 116. LED package 400 is similar to LED package 100, like designed elements being the same. As can be seen in FIG. 7C, the bottom of the slug 116 has a geometric shape, e.g., hexagonal. One or more corners of the slug 116, or the two walls adjacent the corners, are used as the datum reference features 402 in LED package 400. A recessed portion 405 of the body 404 permits access to the reference features 402 on the slug 116.

Figure 8A:
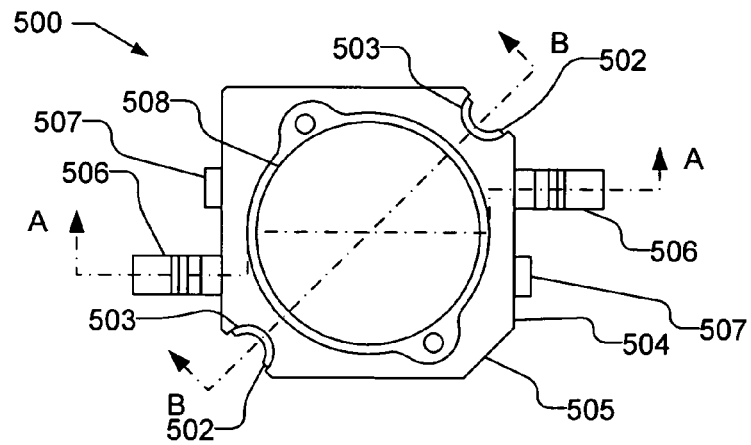
FIG. 8A illustrates a top plan view of another embodiment of an LED package with datum reference features.
Figure 8B:
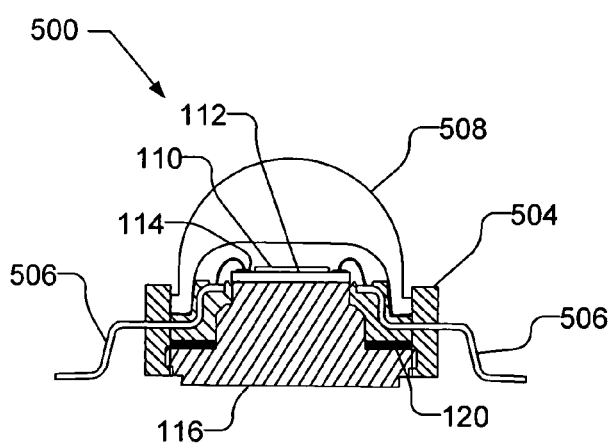
FIGS. 8B and 8C are cross-sectional views of the LED package along lines AA and BB, respectively, in FIG. 8A.
Figure 8C:
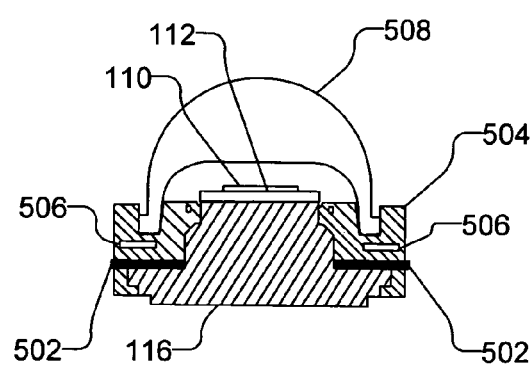
Figure 9:
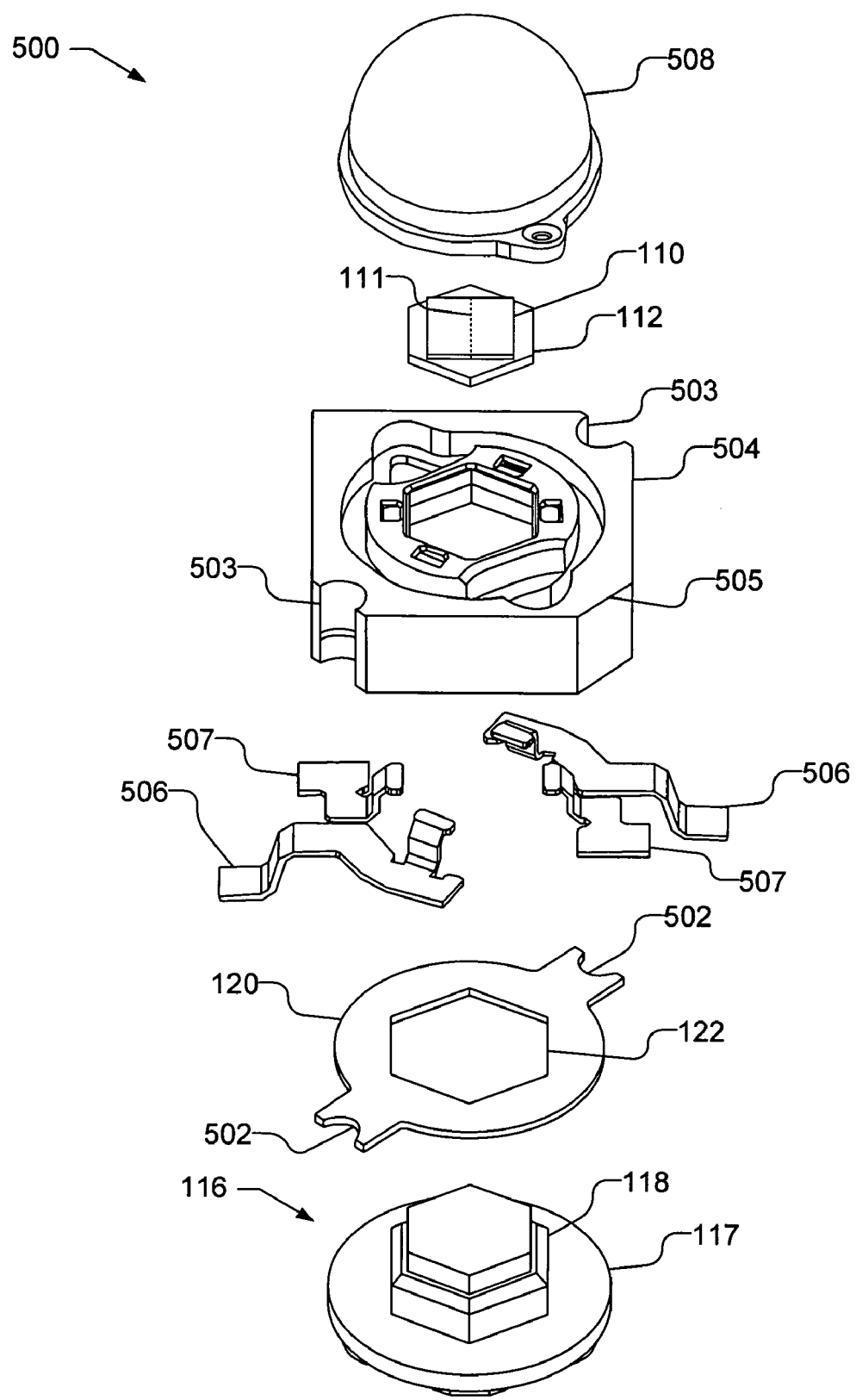
FIG. 9 shows an exploded perspective view of the LED package of FIGS. 8A, 8B, and 8C.

FIG. 8A illustrates a top plan view of another embodiment of an LED package 500 containing reference features 502. FIGS. 8B and 8C are cross-sectional views of LED package 500 along lines AA and BB, respectively, in FIG. 8A. FIG. 9 shows an exploded perspective view of LED package 500.

LED package 500 is similar to LED package 100, like designated elements being the same. However, as illustrated in FIGS. 8A-8C and 9, LED package 500 includes an insulating body 504 that is rectangular, e.g., square, shaped and includes two leads 506 and two trimmed leads 507. As shown in FIG. 9, a single LED die 110 is used, and thus, leads 507 are unnecessary and may be trimmed as shown. Of course, if desired, additional LED dice, illustrated with broken line 111, and leads may be used.

LED package 500 includes reference features 502, which are similar to reference features 302 shown in FIGS. 6A and 6B. Reference features 502 are semicircular in shape and are exposed by recessed portions 503 of the body 504. Reference features 502 may have other shapes if desired. The reference features 502 are shown as located on the corners of the square body 504, but can be located along the sides of the insulating body 504 if desired. As illustrated in FIG. 9, the reference features 502 may be formed as indentations in tabs 121 on the collar 130.

LED package 500 also includes an orientation feature 505 that permits a user to easily determine the orientation of the LED package 500, i.e., provides a reference for the anode and cathode leads. Moreover, the orientation feature 505 ensures the correction orientation of the device during the pick-and-place process. The orientation feature 505 is shown in FIG. 8A as a beveled corner of the body 504.

Figure 10A:
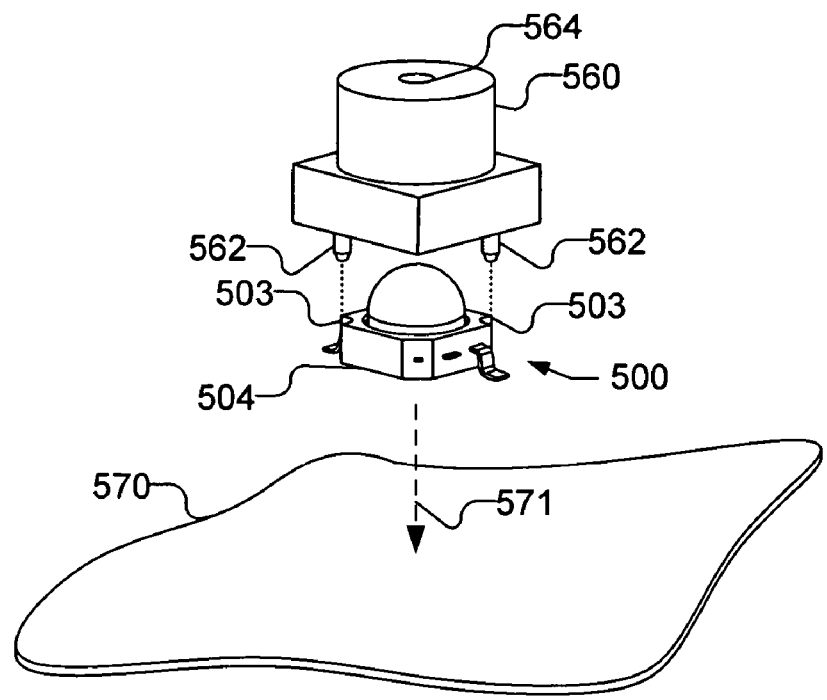
FIG. 10A shows a perspective view of an LED package and a pick-and-place head used to hold the LED package.

FIG. 10A shows a perspective view of LED package 500 and a pick-and-place head 560 that may be used to pick up LED package 500 for inspection, as well as to place the LED package 500 at a desired location, e.g., on an electrical circuit board 570 or other mounting surface, as indicated by arrow 571. Head 560 includes alignment pins 562 that are used in conjunction with reference features 502. Alignment pins 562 are configured to be inserted into the recesses 503 of the body 504 and to align with reference features 502, i.e., the alignment pins 562 may contact the datum reference features 502. Alignment pins 562 may be tapered to aid in positioning relative to the reference features 502. Because the head 560 holds the LED package 500, while the alignment pins 562 are aligned with the datum reference features 502, the position of the LED die 110 with respect to the head 560 is known and can be used in placing and inspecting the LED package 500. An aperture 564 is provided, e.g., to provide a vacuum to pick up LED package 500. The head 560 may also include a pin (not shown) that corresponds with the orientation feature 505, thereby ensuring that the LED package 500 has the correct orientation when held by the head 560.

In operation, the head 560, which may be held by a robotic arm (not shown), is lowered on LED package 500 such that the alignment pins 562 are aligned with the datum reference features 502. If desired, the head 560 may be lowered until the top surface of the insulating body 504 makes contact with the bottom surface of the head 560. Thus, the lens 508 may be inserted into the head 560. The head 560 (and robotic arm) can accurately move and place the LED package 500 at a desired location, e.g., board 570, where the LED package 500 may be bonded, e.g., by solder.

In addition, with the LED package 500 held in the head 560, the LED may also be inspected. By way of example, the head 560 (and robotic arm) may move the LED package 500 to an inspection station where the LED is turned on by providing an appropriate current to the leads 506.

Figure 10B:
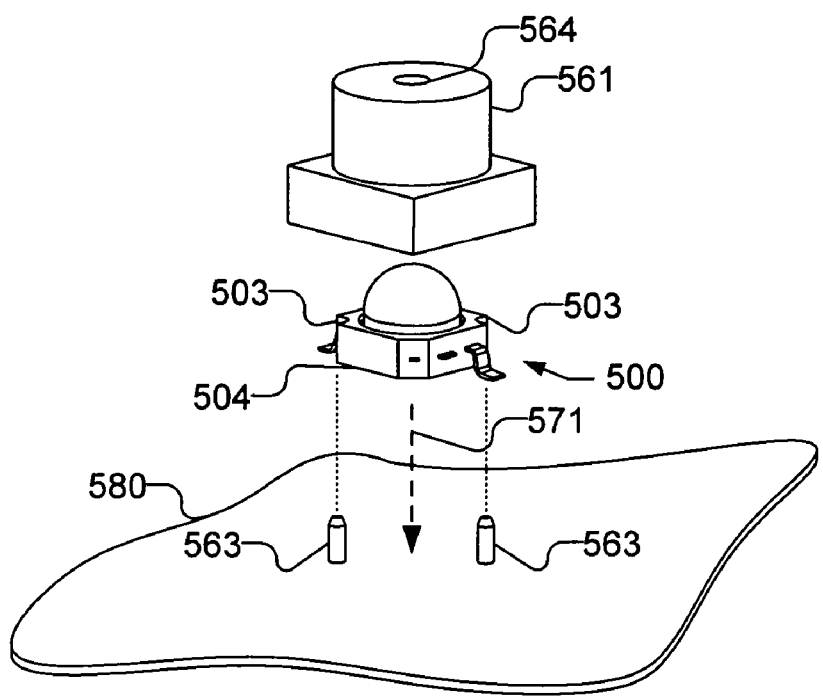
FIG. 10B shows a perspective view of an LED package and a mounting surface with alignment pins that are used to ensure correct alignment of the LED package.

FIG. 10B is a perspective view of LED package 500 and a mounting surface 580 that includes alignment pins 563 that are used to ensure correct alignment of the LED package 500 on the mounting surface 580. The pick and place head 561 need not include alignment pins as the alignment pins 563 that are attached to the mounting surface 580 will ensure correct alignment of the LED package 500 when the LED package 500 is placed on the mounting surface 580, as indicated by arrow 571.

In another aspect of the present invention, the leads 506 are configured to minimize the vertical distance between the lead 506 and the LED die 110, thereby reducing the length of the bond wire. Reducing the length of the bond wire, advantageously, decreases wire stress thereby reducing the failure rate of LEDs.

Figure 11:
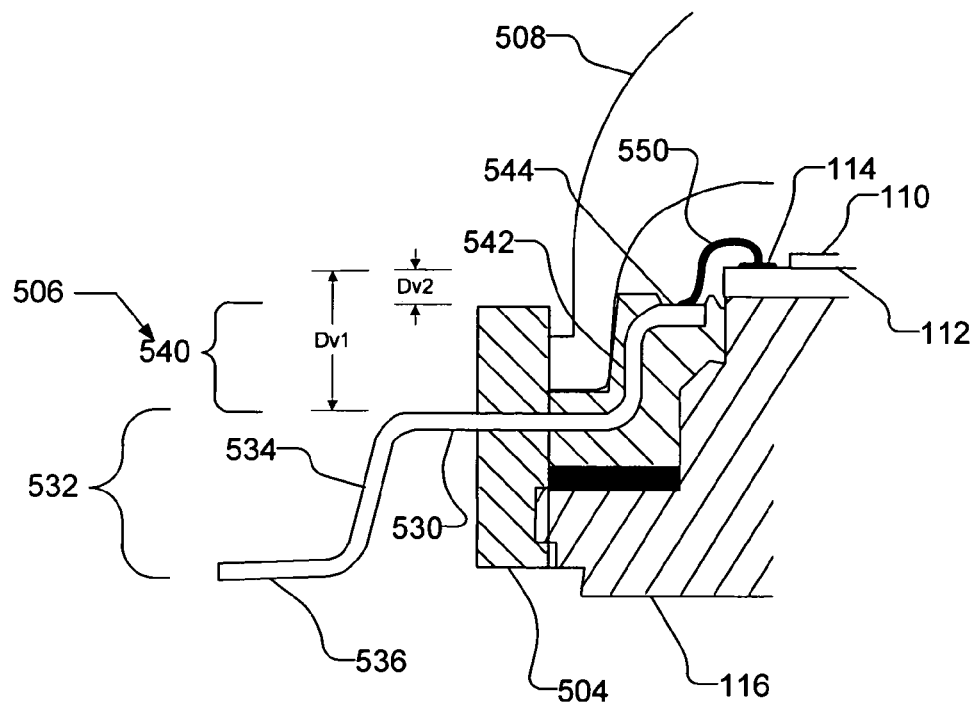
FIG. 11 is a closer view of one of the leads from the LED package shown in FIG. 8B.
Figure 12:
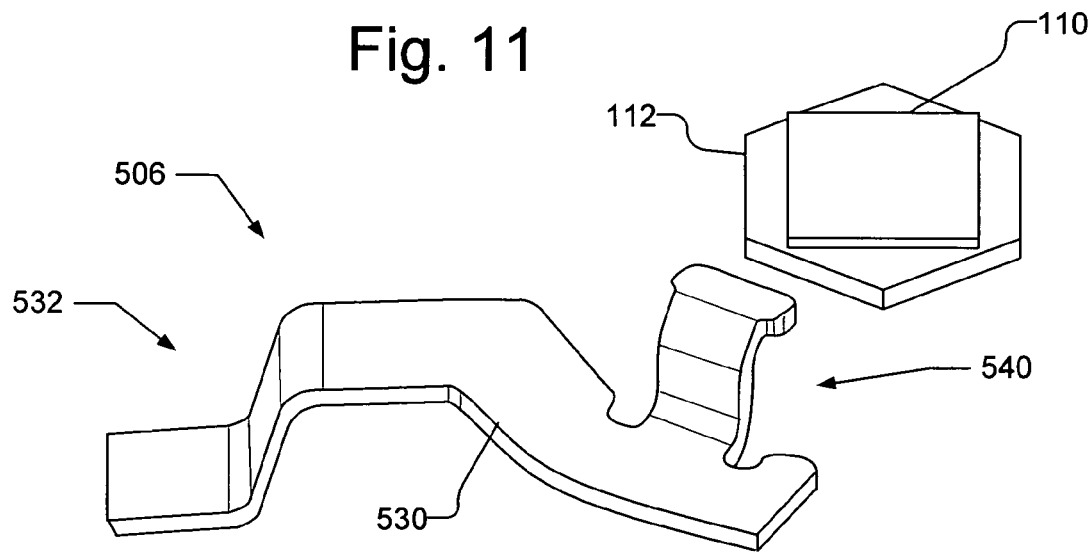
FIG. 12 shows a more detailed perspective view of one of the leads from the LED package shown in FIG. 8C.

FIG. 11 shows a closer view of one of the leads 506 from FIG. 8B and FIG. 12 shows a more detailed perspective view of one of the leads 106. As can be seen in FIG. 11, external to body 504, lead 506 extends approximately horizontally along length 530. External to the body 504, lead 506 may be bent to include a bent section 532, which may be "Z" shaped, i.e., lead 506 may have an approximately downward length 534 and another approximately horizontal length 536. The "Z" shaped section 532 is conventionally used, e.g., for surface mounting. Of course, the external portion of the lead 506 may have a different configuration, e.g., the section 532 may have only a downward length 534, for other types of mounting, e.g., through-hole mounting.

It should be understood that the directional terms used herein, such as downward, upward, horizontal and vertical, are with reference to the figure of LED 500, where the LED package 500 is shown in a general upward orientation, i.e., with the light emission of the LED package 500 directed toward the top of the page.

The horizontal length 530 of lead 506 extends into the body 504, i.e., internally of LED package 500. As shown in FIG. 11, the horizontal length 530 extends under the lens 508 and includes a raised section 540 in which the lead 506 extends vertically toward the LED die 110 and submount 112. Thus, the horizontal length 530 extends into the body 504 at a vertical distance Dv1 (e.g., 1.3 mm) from the LED die 110 and extends vertically to a second vertical distance Dv2 (e.g., 0.4 mm) from the LED die 110, where Dv2 is less than Dv1. The lead 506 may have a "Z" shape within the raised section 540, i.e., lead 506 has an approximately upward length 542 and another approximately horizontal length 544.

As discussed above, submount 112 is formed with a conductive trace that couples the LED die 110 to bond wire contact 114. A bond wire 550 couples the bond wire contacts 114 on submount 112 to the lead 506 where lead 506 has a vertical distance of Dv2 from the LED die 110. By reducing the vertical distance between the lead 506 and the bond wire contact 114, the length of the bond wire 550 is substantially reduced compared to conventional configurations. Conventionally, the vertical distance between a lead and a bond wire contact is approximately 1.6 mm. The use of a shorter bond wire 550 decreases contact problems associated with connecting the lead to the LED die, such as the bond wire 550 breaking or loosing contact with either the bond wire contact 114 or the lead 506.

In addition, as can be seen in FIG. 12, the horizontal length 530 of lead 506 may laterally curve or bend such that the lead 506 extends laterally around at least a portion of the LED die 110. Thus, the raised portion 540 of the lead 506 may be at an angle to the external portion of the lead 506, e.g., the bent section 530. The use of lateral curves in one or more of the leads 506 permits the leads 506 to access the LED die 110 and/or submount 112 from different sides, which is particularly advantageous if a four lead configuration is used and/or if the submount 112 has a non-square configuration.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An assembly comprising:
   an LED die;
   a heat sink, the LED die being coupled to the heat sink so that the LED die has a known positional relationship to the heat sink;
   an insulating body at least partially surrounding the heat sink; and
   at least one datum reference feature external to the insulating body, the datum reference feature having a known fixed positional relationship to the heat sink such that the datum reference feature provides a reference for the position of the LED die, wherein the LED die has a known lateral positional relationship to the heat sink, and the datum reference feature has a known fixed lateral positional relationship to the heat sink such that the datum reference feature provides a reference for the lateral position of the LED die.

2. The assembly of claim 1, wherein there are two datum reference features, the two datum reference features are located at approximately opposite sides of the insulating body.

3. The assembly of claim 1, wherein the datum reference feature is one of a semicircular and "V" shaped notch.

4. The assembly of claim 1, wherein the insulating body includes a recessed portion that exposes the datum reference feature.

5. The assembly of claim 1, wherein the insulating body includes corners and the datum reference feature is located at a corner of the insulating body.

6. The assembly of claim 1, further comprising a submount, the LED die being mounted on the submount and the submount being mounted on the heat sink.

7. The assembly of claim 1, further comprising a mounting surface, the heat sink coupled to the mounting surface.

8. The assembly of claim 7, further comprising at least one alignment pin coupled to the mounting surface, wherein the alignment pin and datum reference feature are configured to align the heat sink to a desired location on the mounting surface.

9. The assembly of claim 1, further comprising a second LED die coupled to the heat sink.

10. An assembly comprising:
    an LED die;
    a heat sink, the LED die being coupled to the heat sink so that the LED die has a known positional relationship to the heat sink;
    an insulating body at least partially surrounding the heat sink;
    at least one datum reference feature external to the insulating body, the datum reference feature having a fixed relationship to the heat sink such that the datum reference feature provides a reference for the position of the LED die; and
    a collar with an aperture approximately in the center of the collar, the datum reference feature being integrally formed from the collar, the collar being mounted on the heat sink by inserting at least a portion of the heat sink through the aperture in the collar.

11. The assembly of claim 10, wherein the collar includes a tab, the datum reference feature is formed by at least a portion of the tab.

12. The assembly of claim 10, wherein the datum reference feature is formed by an indentation in the collar.

13. An assembly comprising:
an LED die;
a heat sink, the LED die being coupled to the heat sink so that the LED die has a known positional relationship to the heat sink;
an insulating body at least partially surrounding the heat sink; and
at least one datum reference feature external to the insulating body, the datum reference feature having a known fixed positional relationship to the heat sink such that the datum reference feature provides a reference for the position of the LED die, wherein the datum reference feature is integrally formed from the heat sink.

14. An LED package comprising:
an LED die;
a heat sink, the LED die being coupled to the heat sink;
an insulating body at least partially surrounding the heat sink;
a lens mounted to the insulating body;
a plurality of leads extending out of the insulating body, at least one lead extending laterally into the insulating body at a first vertical distance from the LED die, the lead extending through the insulating body to a second vertical distance from the LED die, the second vertical distance being less than the first vertical distance, wherein the lead further extends laterally at the second vertical distance and the lead has a "Z" shape within the insulating body; and
a bond wire electrically coupling the lead and the LED die.

15. The LED package of claim 14, wherein the lens has a base, wherein the lead extends laterally under the base of the lens.

16. The LED package of claim 14, further comprising:
a submount, the LED die being mounted on the submount and the submount being mounted on the heat sink, the bond wire being directly coupled to the submount and the lead.

17. The LED package of claim 14, wherein the wire bond is coupled to the at least one lead at the lateral extent of the lead at the second vertical distance.

18. The LED package of claim 14, wherein the lead extends laterally around at least a portion of the LED die.

19. The LED package of claim 14, further comprising a second LED die coupled to the heat sink.

20. An assembly comprising:
an LED die;
a heat sink, the LED die being coupled to the heat sink so that the LED die has a known lateral positional relationship to the heat sink;
an insulating body at least partially surrounding the heat sink; and
means for providing a reference to the lateral position of the LED die, the means for providing a reference being external to the insulating body.

21. The assembly of claim 20, wherein the means for providing a reference comprises a datum reference feature that has a known fixed positional relationship to the heat sink.

* * * * *